United States Patent
Chen et al.

(10) Patent No.: US 7,169,253 B2
(45) Date of Patent: Jan. 30, 2007

(54) PROCESS SEQUENCE FOR PHOTORESIST STRIPPING AND/OR CLEANING OF PHOTOMASKS FOR INTEGRATED CIRCUIT MANUFACTURING

(75) Inventors: Gim-Syang Chen, Allentown, PA (US); Ismail Kashkoush, Orefield, PA (US); Richard Novak, Plymouth, MN (US)

(73) Assignee: Akrion Technologies, Inc., Wilmington, DE (US)

( * ) Notice: Subject to any disclaimer, the term of this patent is extended or adjusted under 35 U.S.C. 154(b) by 0 days.

(21) Appl. No.: 10/909,764

(22) Filed: Aug. 2, 2004

(65) Prior Publication Data

US 2005/0026435 A1    Feb. 3, 2005

Related U.S. Application Data

(60) Provisional application No. 60/491,607, filed on Jul. 31, 2003.

(51) Int. Cl.
   *C23F 1/00*    (2006.01)
   *H01L 21/306*  (2006.01)

(52) U.S. Cl. ............... 156/345.11; 156/345.15; 156/345.17; 156/345.18; 156/345.29

(58) Field of Classification Search ............... 156/345.1–345.15, 345.18, 345.27
   See application file for complete search history.

(56) References Cited

U.S. PATENT DOCUMENTS

| | | | |
|---|---|---|---|
| 2002/0011254 A1* | 1/2002 | Puri et al. | 134/1.3 |
| 2002/0157666 A1 | 10/2002 | Kenney et al. | |
| 2003/0045098 A1* | 3/2003 | Verhaverbeke et al. | 438/689 |
| 2003/0172954 A1* | 9/2003 | Verhaverbeke | 134/1.3 |
| 2004/0139985 A1* | 7/2004 | Hegedus et al. | 134/1.3 |
| 2004/0154641 A1* | 8/2004 | Montierth | 134/3 |
| 2002/0221877 | 11/2004 | Bergman | |
| 2004/0221877 A1* | 11/2004 | Bergman | 134/34 |

* cited by examiner

*Primary Examiner*—Duy-Vu N. Deo
(74) *Attorney, Agent, or Firm*—Brian L. Belles; Wolf, Block, Schorr & Solis-Cohen (57) ABSTRACT

A method and system for cleaning and/or stripping photoresist from photomasks used in integrated circuit manufacturing comprising a process and means of introducing a mixture of sulfuric acid and ozone (or a mixture of sulfuric acid and hydrogen peroxide) to the surface of a photomask while applying megasonic energy. The invention also comprises method and system comprising a process and means of introducing ozonated deionized water and/or a low temperature dilute aqueous solution (dAPM) to the surface of photomasks while applying megasonic energy. The process and apparatus also remove post plasma ashed residues and other contaminants from photomask surfaces.

9 Claims, 5 Drawing Sheets

PROCESS SEQUENCE FOR PHOTORESIST STRIPPING AND/OR CLEANING OF PHOTOMASKS FOR INTEGRATED CIRCUIT MANUFACTURING

CROSS-REFERENCE TO RELATED APPLICATIONS

This application claims the benefit of U.S. Provisional Application 60/491,607, filed Jul. 31, 2003, which is hereby incorporated by reference.

FIELD OF THE INVENTION

The present invention relates generally to the field of processing photomasks, and specifically to apparatus and methods for stripping photoresist from photomasks and/or cleaning of photomasks used in integrated circuit ("IC") manufacturing.

BACKGROUND OF THE INVENTION

Integrated circuits ("ICs") are generally manufactured by a process that includes a photolithographic processing step. A photolithographic process step uses photomasks (or reticles) in combination with a light source to optically project a circuit image onto the surface of a silicon wafer or substrate that has a light-sensitive layer, such as photoresist, applied to its surface. A photomask is a transparent ceramic substrate that is coated with a metallic layer forming a pattern for an electronic circuit. During the manufacture of ICs, a pellicle is typically used to seal the photomask from particulate contamination, thereby isolating and protecting the photomask surface from dust or other particles from the focal plane of the photomask pattern.

In order to produce functioning ICs at a high yield rate, the photomask and pellicle need to be free of contamination. Contamination of the photomask can occur both during the manufacture of the photomask itself, and during use of the photomask in the IC manufacturing process, specifically during processing and/or handling of the photomask. One type of contamination is organic/molecular contamination of the photomask surface. Organic/molecular contamination, such as chemical stains or residues, on the surface of the photomask reduces and degrades the transmittance property and/or characteristic of the photomask, ultimately impacting the quality of the semiconductor devices being manufactured.

Another type of contamination that affects the quality of ICs during the photolithography process is particulate contamination. Particulate contamination may include any small particles, such as dust particles, that may be on the photomask or caught between the photomask and the pellicle. Particulate contamination may cause the photolithographic pattern transmitted on the wafer to change, distort, alter, etc. from its intended design, ultimately impacting the quality of the semiconductor device manufactured.

Still another aspect of photomask manufacturing process which is known to affect the quality of the circuit patterns projected during photolithography is the stripping of photoresist from the photomask surface. Similar to the manufacture of the IC devices, during the manufacture of the photomask, photoresist is applied to surface of the photomask and light and/or ultraviolet radiation is applied to the photomask surface in a desired circuit pattern. Once the exposure is completed, the photoresist is removed from the surface of the photomask, thereby revealing the circuit pattern. Proper removal of photoresist is required so as to ensure that the circuit pattern is not changed, distorted, altered, etc. from its intended design.

Because consistent high quality imaging is the goal of every photolithography engineer, substantial efforts go into the proper removal of photoresist during photomask manufacturing and cleaning of the photomask both during photomask manufacturing and as part of their maintenance in IC fabs. Conventional methods employ a high temperature mixture of sulfuric acid and hydrogen peroxide ("SPM") to strip photoresist, and a high temperature mixture of concentrated ammonium hydroxide/hydrogen peroxide ("APM") in a second step to further clean the photomask. Typically, the photomask is rinsed with deionized water ("DIW") after each chemical step and then dried.

As the industry continues to push forward with reduction in IC geometries, the production engineer is required to ensure that lithography maintains performance day after day, lot after lot. Photomasks must consistently print perfect images since this is a major factor affecting device yield. The problem is exasperated by the fact that, photomasks are expensive to purchase and replace. Thus, superior photomask maintenance is one way the lithography engineer can protect high yields and guard the investment that photomasks represent.

Therefore, part of building a robust production system is to implement processes that can clean and return photomasks to production use. Thus, proper cleaning of photomasks is a necessary step that must be incorporated into processing. However, the repetition of conventional cleaning (and stripping) methods have been discovered to deteriorate the life of photomasks.

The goal of the production engineer is more than cleaning photomasks sufficiently to remove contaminants. Extending mask life is also an on-going challenge. Thus, the industry must balance photomask lifetimes against cleaning cycles. Quality cleaning preserves the ability to maintain high device yield while simultaneously extending mask life. Binary and phase shift photomasks, because of their various surface films, require cleaning chemistries strong enough to remove contaminants, yet sensitive enough to avoid damage. Because ICs continue to shrink in size, more stringent cleanliness levels are required. Additionally, new IC manufacturing techniques require advanced photomasks to be designed to allow for small geometries. These advanced masks will see increased cleaning steps and no pellicle protection.

Currently, photoresist cleaning processes are typically done on a single mask spray cleaner tool. Current cleaning techniques include spraying/brushing cleaning, which uses a mixture of SPM followed by ammonia cleans. Problems with the current state of the art processes are that they often suffer from poor chemical mixing or very poor rinsing, resulting in high sulfur content on the surface, which negatively impacts the subsequent mask manufacturing or photolithography processes due to haze. Other problems with state of the art processes are often inconsistent process temperatures due to the way chemicals are heated and introduced to the plate, high rates of chemical consumption, and the fact that brushes tend to induce permanent defects, like scratches, which are tough to remove from the photomask.

Existing methods of stripping photoresist from photomasks during their manufacture use chemistries and recipes similar to those discussed above regarding cleaning in IC fabs. Consequently, current photoresist stripping methods used suffer from many of the same problems and inefficiencies.

SUMMARY OF THE INVENTION

It is thereferore an object of the present invention is to provide a method and system for photoresist stripping and/or cleaning of photomasks.

Another object of the present invention is to provide a method and system for photoresist stripping and/or cleaning of photomasks that increases device yield during IC manufcture.

Yet another object of the present invention is to provide a method and system for photoresist stripping and/or cleaning of photomasks that reduces defects and/or contamination on photomasks.

Still another object of the present invention is to provide a method and system for photoresist stripping and/or cleaning of photomasks that increases the life of a photomask.

A further object of the present invention is to provide a method and system for photoresist stripping and/or cleaning of photomasks that afford the use of reduced temperature chemistries to facilitate cleaning and/or photoresist stripping.

A yet further object of the present invention is to provide a method and system for photoresist stripping and/or cleaning of photomasks that reduces the number of particles, haze, and/or ionic residues, e.g., sulfates, on the clear or dark areas of the photomasks without damage to the anti-reflective coating film, e.g., CrOxNy, on the masks.

Another object is to provide a method and system for photoresist stripping and/or cleaning of photomasks that reduces and/or minimizes the phase shift, transmission loss, and critical dimension ("CD") variations.

The present invention comprises, in one aspect, a method of stripping photoresist from photomasks and/or cleaning photomasks which yields low defects using a mixture comprising sulfuric acid and ozone gas ("SOM") in combination with megasonic energy. Specifically, the invention is a method of photoresist stripping and/or cleaning photomasks comprising: supporting a photomask in a process chamber; and applying SOM to the photomask while applying acoustical energy to the photomask. Depending on the exact needs and point of the photomask lifetime, the photomask supported in the process chamber may or may not have photoresist applied to its surface. Optionally, the SOM can further include hydrogen peroxide ($H_2O_2$).

While higher temperatures generally result in higher photoresist etch rates (and in some cases faster cleaning), high temperature SOM can also etch the photomask material (quartz or glass) and thus change the optical properties (e.g., phase and transmission) and/or remove the anti-reflective ("AR") coating on the photomask due to the SOM's high oxidation power. The use of megasonic energy combined with the application of the SOM to the photomask surface enables the use of lower temperature SOM without sacrificing etching rate (and/or cleaning rate). Thus, the SOM applied to the photomask according to the present invention is preferably at a low temperature, most preferably less than 90° C., and optimally at or about 80° C.

It is further preferable that the SOM be substantially free of bubbles when applied to the photomask. The use of bubble-free SOM enhances the megasonic acoustic transmission and results in improved contamination removal.

The photomask can be rinsed with deionized water while applying megasonic energy to the photomask after application of the SOM. This rinsing can take the form of any conventional rinsing technique, including cascade rinsing, a quick dump rinsing, or the application of DIW to the surface of a rotating photomask. After rinsing is complete, the method can further include the step of applying ozonated deionized water ($DIO_3$) to the photomask. Preferably, the $DIO_3$ has a concentration of ozone less than 100 parts per billion deionized water.

In another embodiment, the method further comprises the step of applying a dilute aqueous solution of ammonium hydroxide and hydrogen peroxide (dAPM) to the photomask while simultaneously applying acoustical energy to the photomask. In this step, the dAPM is applied at a temperature less than 30° C. The dAPM application is preferably performed after the $DIO_3$ application step. The weight ratio of ammonium hydroxide to hydrogen peroxide to water in the dAPM solution is preferably about 1:y:x where 2<y<10 and 200<x<1000, and optimally at 1:2:350.

In yet another embodiment, the method will further comprise the step of rinsing the photomask with deionized water while applying acoustical energy to the photomask after the application of the dAPM. As with the first rinsing step, this rinsing step can take the form of any conventional rinsing technique.

Finally, it is most preferable that all of these steps be performed sequentially, without any intervening steps. Optionally, the method can further include a drying step once all of the above steps are completed. The drying step can be performed using any conventional drying method, such as those that use isopropyl alcohol ("IPA") or spin drying. The drying step can include exposing the mask to a UV energy source.

In another aspect, the invention comprises using a low temperature dilute aqueous solution of ammonium hydroxide and hydrogen peroxide (dAPM) in combination with megasonic energy to clean and/or photoresist strip photomasks. Specifically, in this aspect, the invention is a method of cleaning and/or photoresist stripping photomasks comprising: supporting a photomask in a process chamber; and applying a dilute aqueous solution of ammonium hydroxide hydrogen peroxide (dAPM) to the photomask while applying megasonic energy. Depending on the application, the photomask supported in the process chamber may or may not have photoresist applied to its surface.

It has been discovered that high temperature and/or concentrated APM also etches the mask material (quartz or glass) and thus changes the optical properties, e.g., phase and transmission. According to the current invention, contaminants are removed while phase and transmission characteristics remain unchanged (or changed to an absolute minimum). Applying megasonic energy to the photomask during the application of dAPM allows the use of low temperature and ultra dilute APM to achieve the same contamination removal without etching the mask. Preferably, the dAPM applied in the invention is at a temperature less than 30° C. and having a weight ratio of ammonium hydroxide to hydrogen peroxide to water of about 1:y:x where 2<y<10 and 200<x<1000, and optimally 1:2:350.

In one embodiment, it is preferred that this method further comprise the step of applying a mixture of deionized water and ozone ($DIO_3$) to the photomask prior to the application of the dAPM. After application of the dAPM, the photomask can be rinsed with deionized water while applying acoustical energy to the photomask.

In a further aspect, the invention is a method of photoresist stripping and/or cleaning photomasks comprising: supporting a photomask in a process chamber; and applying a mixture comprising sulfuric acid and hydrogen peroxide (SPM) to the photomask while applying acoustical energy to the photomask. Combining the application of SPM with megasonic energy to the phootmask affords the use of lower temperature SPM, similar to that discussed above in relation to the application of SOM and megasonic energy. In this embodiment, the SPM can further include dissolved ozone gas.

In still another aspect, the invention is a system for cleaning and/or photoresist stripping of photomasks comprising: means to supply a mixture of sulfuric acid and ozone ("SOM") to a photomask; and means to supply acoustical energy to the photomask. Preferably, a controller is provided that is adapted to activate the acoustical energy supply means during supply of SOM to the photomask so that the acoustical energy is supplied to the photomask contemporaneously with the application of the SOM.

The system can further comprise means to supply ozonated deionized water ($DIO_3$) to the photomask and means to supply a dilute aqueous solution of ammonium hydroxide and hydrogen peroxide (dAPM) at a temperature less than 30° C. to the photomask. An inline cooler can be provided with the system to ensure that the dAPM is sufficiently cooled. The system can additionally comprises means to supply a drying fluid to the photomask.

In a still further aspect, the invention is a system for cleaning and/or photoresist stripping of photomasks comprising: means to supply a dilute aqueous solution of ammonium hydroxide and hydrogen peroxide (dAPM) at a temperature less than 30° C. to a photomask; and means to supply acoustical energy to the photomask. A controller is preferably provided that is adapted to activate the acoustical energy supply means during supply of dAPM to the photomask.

In yet another aspect, the invention can be a system for cleaning and/or photoresist stripping of photomasks comprising: means to supply a mixture of sulfuric acid and hydrogen peroxide ("SPM") to a photomask; and means to supply acoustical energy to the photomask. Preferably, a controller is provided that is adapted to activate the acoustical energy supply means during supply of SPM to the photomask so that the acoustical energy is supplied to the photomask contemporaneously with the application of the SPM.

The systems of the present invention can be implemented into a variety type of photomask processing tools, including wet bench type tools and single wafer processing chambers. When the system of the invention is implemented into a single wafer processing chamber, a photomask is supported in the process chamber, and preferably rotated. As such, all of the steps of the method of the invention can be carried out in a single process chamber without moving the photomask from chamber to chamber.

However, when the systems of invention are embodied in a wet bench type tool, a plurality of tanks will be needed, one for each chemistry to be applied to the photomask. In this embodiment, a plurality of photomasks can be processed simultaneously using immersion techniques. In more preferred embodiment, there are six tanks.

The first tank is specifically designed for the application SOM, SPM, or a combination of both SOM for removing organic residues and post plasma ashed residues from photomask surfaces. The first tank is preferably constructed of a fluoropolymer or quartz and is operably coupled to an in-line heater, a megasonic transducer, an ozone generator, and a mixing device. The stripping temperature is preferably controlled to below 90° C. The first tank also preferably has a high recirculation rate of at least two tank turnovers per minute with a filter which is of 0.05 micron (µm) pore size or smaller. The megasonic transducer is preferably of the direct coupled type with a power of about 1.0 MHz. The supply line for the first tank is preferably built of flouropolymer or quartz, and equipped with an 8 kW quartz halogen in-line heater, megasonics, and is connected to a 90 gallon per hour ozone generator. An inline concentration control sensor can be coupled to the supply line to monitor the concentration of ozone in the SOM (or SOM/SPM combination) prior to the SOM (or combined SOM/SPM) entering the first tank.

The second tank is for rinsing photomasks and is preferably a QDR tank that can be run in either the QDR mode or in an overflow/cascade mode or both. The second tank is also preferably equipped with megasonics and has point of use filtration and purification (POUFP) at 0.04 or 0.01 µm pore size that removes both positively and negatively charged particles and ionic contaminants. The second tank is preferably constructed of high purity flouropolymer or quartz and provides a high flow rinse to quickly quench reactions and remove chemical residues, including sulfates, from the photomask surfaces. Rinse water temperature can vary from ambient to less than 90° C.

The third tank is preferably for applying high concentration $DIO_3$ and can be constructed of a flouropolymer (e.g., PFA or PVDF). An inline concentration sensor can be provided to monitor the concentration of ozone in the incoming $DIO_3$. The main purpose of this ambient or above ambient temperature $DIO_3$ application is for removing any remaining organic residues and post plasma ashed residues from photomask surfaces without leaving haze or sulfate residues. For above ambient applications, a heater can be supplied on the $DIO_3$ supply line The fourth tank is preferably for providing the dAPM to the photomask and is built of PFA, and equipped with an inline cooling unit, megasonics, and two chemical storage vessels. The fourth tank is specifically designed to receive ultra diluted APM application for removing particulates on both binary and phase-shifted (PSM) mask surfaces. The dAPM can be introduced at a temperature below 30° C., preferably between about 10 and 30° C. A high power 1.0 MHz (or Direct Coupled Megasonic) megasonic transducer array in the dAPM process tank maximizes the particle removal efficiency on mask surfaces. Inline concentration sensor and automated control is also preferably provided for this tank.

The fifth tank is preferably another QDR module for rinse after dAPM application and is constructed as a copy of the second tank, but can be set up differently depending on the desired results.

The sixth tank is preferably a dryer that uses a minute volume of IPA liquid (<10 ml per run) and will provide masks free of haze, streaks, and watermark after drying.

Other tank and tool configurations are of course possible, but in each case the apparatus is equipped with one or more sources of megasonic energy and adapted for applying SOM, SPM, and/or dAPM to photomasks while applying megasonic energy. For example, in another aspect of the invention the functioning of the six tank tool described above can be incorporated into a single process chamber system that is used for single wafer processing. In this single wafer system, the chemicals and rinse water will be applied to the surface of the photomask sequentially in the same chamber while the photomask is preferably rotating. The chemicals and rinse water can be supplied via multiple nozzles or a single nozzle connected to a plurality of supply lines. Megasonic energy can be applied to the photomask in the single chamber system via any known means, including for example an elongated probe transmitter or a plate-like transducer assembly.

Finally, the invention is not limited to systems incorporating all of the aforementioned features but can include systems incorporating one or more of the above referenced elements. For example, the system may only incorporate the hardware for SOM applications, the hardware for dAPM applications, or the hardware for SPM applications and still be within the scope of the present invention.

Finally, the invention can be practiced during photomask manufacturing or during photomask cleaning in the IC fabs. During photomask manufacturing, the SOM (or SPM) application can be used for photoresist removal. However, in order to achieve the lowest contamination possible on a photomask before shipment, the photoresist removal and clean are preferably performed using one of the systems of invention, using the method of the invention. The process for resist removal and cleaning in such an instance will preferably be SOM (or SPM) /Rinse/dAPM/Rinse/Dry, where megasonic energy is also applied to the photomask during the SOM (or SPM), dAPM, and rinse steps. Additionally, the SOM (or SPM) application can be replaced with an application of a mixture having sulfuric acid, ozone, and hydrogen peroxide (SOM/SPM).

When the invention is used for cleaning in embodiments where no stripping is needed, a typical cleaning step sequence can be "SOM (or SPM)/Rinse/DIO3/APM/Rinse/Dry, where megasonic energy is also applied to the photomask during the SOM, dAPM, and rinse steps. However, it is possible for the cleaning sequence to be DIO3/APM/Rinse/Dry, where megasonic energy is also applied to the photomask during the dAPM and rinse step. Moreover, the SOM (or SPM) application can be replaced with an application of a mixture having sulfuric acid, ozone, and hydrogen peroxide (SOM/SPM).

DETAILED DESCRIPTION OF THE DRAWINGS

Figure 1:
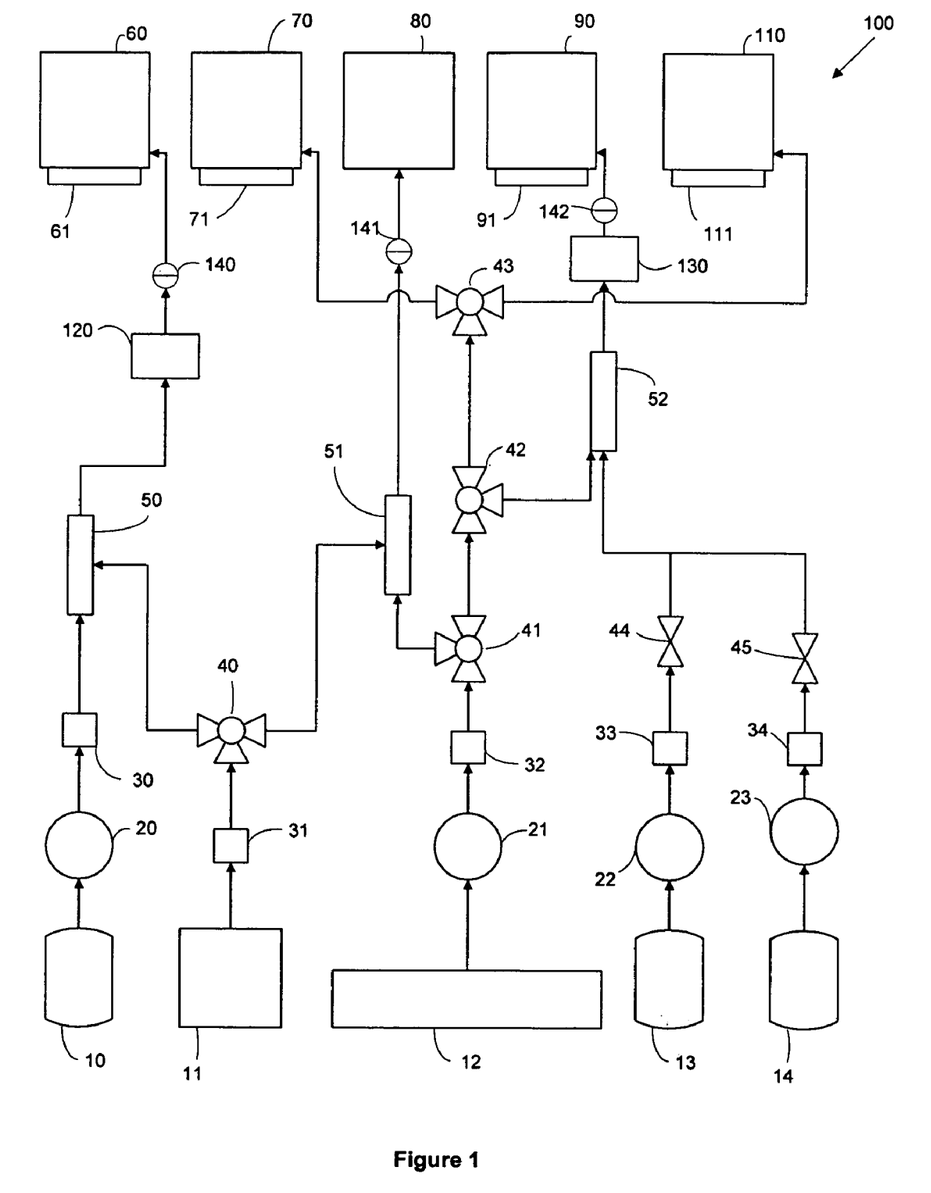
FIG. 1 is a schematic of a wet-bench system adapted for stripping and/or cleaning photomasks according to an embodiment of the present invention.

FIG. 1 illustrates wet bench system 100 adapted to clean and/or strip photoresist from photomasks according to an embodiment of the present invention. Wet bench system 100 comprises five process tanks 60, 70, 80, 90, and 110. All five process tanks 60, 70, 80, 90, and 110 are capable of holding a plurality of photomasks for immersion processing. When positioned in process tanks 60, 70, 80, 90, and 110, the photomasks will be oriented in a substantially vertical orientation. Megasonice energy sources 61, 71, 91, and 111 are operably coupled to tanks 60, 70, 90, and 110 respectively for supplying megasonic acoustical energy to photomasks positioned in the respective tank. While megasonic energy sources 61, 71, 91, and 111 are illustrated as being positioned at the bottom of tanks 60, 70, 90, and 110 respectively, the invention is not limited to any specific placement, orientation, or number of megasonic sources on the tanks, so long as the acoustical energy can be supplied to photomasks while in the tanks. For example, the megasonics can be provided inside or outside the tanks and at any orientation, including vertically, horizontally, and/or angled. The invention is also not limited to any specific kind of megasonic energy source. For example, both direct coupled and fluid coupled megasonics can be used.

Tank 60 is adapted to be supplied with a mixture of sulfuric acid and ozone ("SOM"). Tanks 70 and 110 are adapted to be supplied with deionized water ("DIW"). Tank 80 is adapted to be supplied with ozonated deionized water ("DIO$_3$"). Tank 90 is adapted to be supplied with a low temperature dilute aqueous solution of ammonium hydroxide and hydrogen peroxide ("dAPM"). Optionally, a sixth process tank (not illustrated) can be provided in wet bench system 100 for drying the photomasks with a drying fluid comprising isopropyl alcohol ("IPA"). The drying step can also include exposing the photomask to UV source to ensure extra drying of moisture.

Wet bench system 100 also comprises sulfuric acid reservoir 10, ozone generator 11, DIW reservoir 12, ammonium hydroxide reservoir 13, and hydrogen peroxide reservoir 14. A plurality of pumps 20–23 are provided to draw fluid flow from the various reservoirs 10–14 and force flow through a desired plumbing path, and into the desired tank 60, 70, 80, 90, or 110 as needed during photomask cleaning and/or stripping. Mass flow controllers 30–34 are provided fluidly and operably coupled to their respective fluid lines to respectively control the flow rates of sulfuric acid, ozone, DIW, ammonium hydroxide, and hydrogen peroxide. As such, the concentration ratios of the components of the various mixtures formed by wet bench system 100 in carrying out the method of the invention can be controlled.

Three way valves 40–43 are provided that are fluidly and operably incorporated in the plumbing to form junctions for directing the flow ozone and/or DI water through desired plumbing paths during operation of wet bench system 100. Open/close valves 44 and 45 are also provided that are fluidly and operably connected to the fluid lines coming from ammonium hydroxide reservoir 13 and hydrogen peroxide reservoir 14 respectively. Open/close valves 44 and 45 are provided so that the flow of ammonium hydroxide and hydrogen peroxide can be allowed and/or prohibited as needed during operation of wet bench system 100.

Wet bench system 100 also comprises a plurality of static mixers 50–52. Static mixers 50–52 are fluidly and operably coupled at key positions in the plumbing to effectuate the creation of the mixtures and/or solutions needed to operate wet bench system 100 in performing the method of invention. Static mixers 50–52 create the necessary mixtures and/or solutions by mixing the incoming component fluids by creating turbulent flow with a plurality of baffles.

Inline heater 120 and inline cooler 130 are also provided in wet bench system 100. Inline heater 120 is operably coupled to the SOM supply line of tank 60 so that SOM being supplied to tank 60 can be heated to the desired processing temperature. Inline cooler 130 is operably coupled to dAPM supply line of tank 90 so that dAPM being supplied to tank 90 can be cooled to the desired processing temperature. Alternatively, inline heater 120 and inline cooler 130 can be replaced with devices that perform both heating and cooling functions.

Inline concentration sensors 140–142 are also provided in wet bench system 100 to ensure that the concentrations of the component fluids in the mixtures and/or solutions of the invention are proper. Inline concentration sensors 140–142 are provided at or near the inlet of each tank 60, 80 and 110. Alternatively, inline concentration sensors can be coupled at any point on the respective supply line, recirculation line, or in the tank itself.

It is also preferable to provide appropriate filtration and/or purification apparatus to system 100 to filter and purify the fluids before they enter tanks 60, 70, 80, 90, and 110 and contact the photomasks. This avoids/reduces the problem of the fluids themselves carrying contaminants to the surfaces of the photomasks. Preferably, the filtration and/or purification apparatus are provided at the point of use for each tank, and most preferably within 12 inches of each tank.

While not illustrated, wet bench system 100 also comprises a properly programmed controller so that the system 100 can be automated. All of the components of wet bench system 100 are electrically and operably coupled to the controller, such as pumps 20–23, three way valves 40–43, mass flow controllers 30–34, inline heater 120, inline cooler 130, open/close valves 44–45, megasonic sources 61, 71, 91, and 111, concentration sensors 140–142, and all other hardware components. The controller can be a suitable microprocessor based programmable logic controller, personal computer, or the like for process control and preferably includes various input/output ports used to provide connections to the various components of the wet bench system 100 that need to be controlled and/or communicated with. The controller also preferably comprises sufficient memory to store process recipes and other data, such as contamination thresholds inputted by an operator, processing times, processing conditions, and the like. The controller can communicate with the various components of the system 100 to automatically adjust process conditions, such as temperatures, mass flow rates, etc. as necessary. The type of controller depends on the needs of the system in which it is incorporated.

The functioning of wet bench system 100 in supplying SOM and megasonics to the surface of a photomask positioned in tank 60 will now be described. Upon receiving an activation signal, the controller activates pump 20 and ozone generator 11. Upon being activated, pump 20 draws sulfuric acid from sulfuric acid reservoir 10 and forces the sulfuric acid through mass flow controller 30 and into static mixer 50. Simultaneously, upon being activated ozone generator 11 produces ozone which is flowed through mass flow controller 31 into three-way valve 40. Mass flow controllers 30 and 31 are set at predetermined mass flow rates. At this point, three-way valve 40 is set so that all of the ozone is directed into static mixer 50. As ozone gas and sulfuric acid are fed into static mixer 50, the ozone gas mixes with and dissolves into the sulfuric acid, thereby forming a mixture of sulfuric acid and ozone (SOM).

The SOM then exits static mixer 50 and passes through inline heater 120 and into tank 60. In one embodiment, inline heater 120 is set by controller so as to heat the SOM passing therethough to a temperature of around 80° C. However, the controller can be programmed to heat (and possibly cool) to the SOM to any desired temperature. However, it is preferred that the SOM be at a low temperature when contacting the photomask, most preferably less than about 90° C.

Inline concentration sensor 140 is provided on the supply line between inline heater 120, and tank 60. Inline concentration sensor 140 is adapted to repetitively measure the concentrations of ozone and sulfuric acid in the SOM passing through. Inline sensor 140 produces and transmits signals indicative of the measured concentrations to the controller for comparison to a stored desired concentration value. If the measured concentrations of ozone and sulfuric acid is not at or near the desired concentrations, the controller will automatically adjust mass flow controller 30 and/or mass flow controller 31 appropriately to achieve the desired concentration ratio. Inline concentration sensor 140 will continuously measure the concentrations of the SOM and communicate with controller so that appropriate adjustment can be undertaken during the processing of photomasks. In one embodiment the desired concentration of the SOM is 98% by weight sulfuric acid and/or the ozone concentration is less than 50 parts per million sulfuric acid.

Upon reaching tank 60 with desired concentrations, the SOM fills and overflows tank 60. Optionally, a recirculation line (not illustrated) and filtration and purification apparatus can be incorporated if desired. During this time, megasonic energy source 61 is activated by the controller and megasonic energy is supplied to the SOM in tank 60. Megasonic energy source 61 is preferably of the direct coupled type and operated at a frequency of about 1.0 MHz.

Once the megasonics are activates, a photomask (or plurality of photomasks) is submerged in tank 60, causing the SOM to contact the surfaces of the photomask while the megasonic energy simultaneously contacts the photomask. Depending on the application, the photomasks may or may not have photoresist on their surfaces at this time. If the photomasks do have photoresist, the application of SOM and megasonic energy is applied for a sufficient time to remove substantially all of the photoresist, preferably for about 8 minutes with the megasonic energy being applied at a power less than or equal to 1600 watts. However, the process time and conditions of the SOM application can change depending on the exact processing needs.

Tank 60 is preferably constructed of fluoropolymer or quartz. Tank 60 can be adapted to contain a recirculation line. In this embodiment, tank 60 should have a high recirculation rate of at least two tank turnovers per minute with a filter which is of 0.05 micron (μm) pore size or smaller. The supply line for tank 60 is preferably built of flouropolymer or quartz. Inline heater 120 can be an 8 kW quartz halogen in-line heater. Ozone generator 11 preferably has a 90 gallon per hour ozone generation rating.

Once the SOM application step is completed in tank 60, the photomask (or photomaks) is transferred to tank 70 for rinsing with DIW while applying megasonic energy. The functioning of wet bench system 100 in supplying DIW and megasonics to the surface of a photomask positioned in tank 70 will now be described.

When the photomak is ready for rinsing in tank 70, the system controller activates pump 21. Pump 21 draws DIW from DIW reservoir 12 and forces the DIW through mass flow controller 32 and into three-way valve 41. The system controller has adjusted three-way valve 41 so that all of the DIW coming into three-way valve 41 is directed into three-way valve 42. Similarly, three-way valve 42 directs all incoming DIW into three-way valve 43, which in turn, directs all of the DIW to tank 70. While not illustrated, a point of use filtration and purification (POUFP) apparatus is preferably provided on the DIW supply line so that all DIW passing into tank 70 passes therethrough. The POUFP apparatus preferably has a 0.04 or 0.01 μm pore size rating and removes both positively and negatively charge particles and ionic contaminants.

The filtered and purified DIW then enters and fills tank 70. The photomaks are then submerged in the DIW. Tank 70 can be run in a quick dump rinse (QDR) mode but can be run in an overflow/cascade mode. During the rinsing, the system controller activates megasonic energy source 71 so that megasonic energy is applied to the photomask during the DIW rinse. Tank 70 is constructed of high purity flouropolymer or quartz and provides a high flow rinse to quickly quench reactions and remove chemical residues including sulfates from the photomask surfaces. The temperature of the DIW in tank 70 can vary from ambient to less than 90° C. If necessary, a cooler or heater can be provided on the DIW supply line.

Depending on the application, once the DIW rinse is completed in tank 70, the photomask (or photomaks) may or may not be transferred to tank 80 for application of $DIO_3$. The functioning of wet bench system 100 in supplying $DIO_3$ to the surface of a photomask positioned in tank 80 will now be described.

When the photomak is ready for the application of $DIO_3$ in tank 80, the system controller activates pump 21 (if not already activated) and ozone generator 11. As in the rinse step, pump 21 draws DIW from DIW reservoir 12 and forces the DIW through mass flow controller 32 and into three-way valve 41. Three-way valve 41 has been adjusted by the system controller so that all of the DIW coming into three-way valve 41 is directed into static mixer 51. The ozone created by ozone generator 11 is flowed through mass flow controller 31 and into three-way valve 40. Three-way valve 40 has been adjusted by the system controller so that all of the ozone flowing into three-way valve 40 is directed into static mixer 51.

As the DIW and ozone flow into static mixer 51, the ozone gas mixes with and dissolves into the DIW, thereby forming $DIO_3$. The $DIO_3$ exits static mixer 51 and flows into tank 80. Inline concentration sensor 141 is provided on the $DIO_3$ supply line after static mixer 51 to monitor the concentration of ozone in the incoming $DIO_3$. Inline concentration sensor 141 is adapted to repetitively measure the concentration of ozone in the incoming $DIO_3$. Inline concentration sensor 141 will produce and transmit signals indicative of the measured concentrations to the system controller for comparison to a stored desired concentration value. If the measured concentrations of ozone is not at or near the desired concentration, the controller will automatically adjust mass flow controller 31 and/or mass flow controller 32 appropriately to achieve the desired concentration of ozone. Inline concentration sensor 141 will continuously measure the concentration of the ozone in the incoming $DIO_3$ and communicate with the system controller so that appropriate adjustment can be undertaken during the processing of photomasks.

Photomasks are submerged in the $DIO_3$ in tank 80. Wet bench system 100 is adapted to supply high concentration $DIO_3$ to tank 80 at ambient or above ambient temperatures. For above ambient temperature applications, a heater can be supplied to the $DIO_3$ supply line. $DIO_3$ is applied to the photomasks to remove any remaining organic residues and post plasma ashed residues from the photomask surfaces without leaving haze or sulfate residues. Tank 80 can be constructed of a flouropolymer (e.g., PFA or PVDF).

After the $DIO_3$ application, the photomak is ready for the application of dAPM in tank 90. At this stage, system controller activates pumps 22 and 23. Pump 22 draws ammonium hydroxide from reservoir 13 and flows the ammonium hydroxide through mass flow controller 33. Similarly, pump 23 draws hydrogen peroxide from reservoir 14 and flows the hydrogen peroxide through mass flow controller 34. The system controller opens valves 44 and 45, thereby allowing the ammonium hydroxide and the hydrogen peroxide fluid streams to flow therethrough, converge, and flow into static mixer 52.

Simultaneously with activating pumps 22 and 23, the system controller adjusts three-way valve 42 so that the flow of DIW is diverted from three-way valve 43 and into static mixer 52. As the DIW, ammonium hydroxide, and hydrogen peroxide flow through static mixer 52, the liquids become thoroughly mixed from the turbulent flow, forming an aqueous solution of ammonium hydroxide and hydrogen peroxide. The system controller is programmed to control the flow rates of the DIW, ammonium hydroxide, and hydrogen peroxide via mass flow controller 32, 33, and 34 respectively so that a dilute aqueous solution of ammonium hydroxide and hydrogen peroxide (dAPM). Preferably, the dAPM is ultra dilute, having a weight ratio of ammonium hydroxide to hydrogen peroxide to water in the dAPM is about 1:2:x where $200 < x < 1000$.

The dAPM formed in static mixer 52 flows into tank 90. Inline concentration sensor 142 is provided to measure the concentrations of the DIW, ammonium hydroxide, and hydrogen peroxide of the incoming dAPM. Inline concentration sensor 142 repetitively measures the concentrations of DIW, ammonium hydroxide, and hydrogen peroxide in the dAPM. Inline concentration sensor 142 produces and transmits signals indicative of the measured concentrations to the controller for comparison to stored desired concentration values. If the measured concentration are not at or near the respective desired concentrations, the controller will automatically adjust mass flow controllers 32–34 appropriately to achieve the desired concentrations. Inline concentration sensor 142 will continuously measure the concentrations of the dAPM and communicate with the controller so that appropriate adjustment can be undertaken during the processing of the photomasks.

Inline cooler 130 is operably coupled to the dAPM supply line after static mixer 52 and prior to tank 90. Inline cooler 130 is provided so that the temperature of the dAPM passing through can be cooled down to a desired level prior to entering tank 90. The system controller is electrically connected to inline cooler 130 for control and necessary adjustments. The dAPM can be cooled to a temperature below 30° C., preferably between about 10 and 30° C.

Upon reaching tank 90 with desired concentrations, the dAPM fills and overflows tank 90. During this time, megasonic energy source 91 is activated by the controller, thereby supplying megasonic energy to the dAPM (and any photomasks) in tank 90. Megasonic energy source 91 is preferably of the direct coupled type and operated at a frequency of about 1.0 MHz.

The application of the dAPM to the photomasks in tank 90 is for removing particulates on both binary and phase-shifted (PSM) photomask surfaces. Applying megasonic energy to the photomasks via megasonic source 91 during immersion in the dAPM allows the dAPM to be at a lower temperature without sacrificing process speed and effectiveness. Tank 90 can be built of PFA. Megasonic source 91 can be a high power 1.0 MHz (or Direct Coupled Megasonic) megasonic transducer array in the dAPM process tank that maximizes the particle removal efficiency on mask surfaces.

When the application of the dAPM is complete, the photomak is ready for rinsing in tank 110. The system controller activates pump 21 (if not activated). Pump 21 draws DIW from DIW reservoir 12 and forces the DIW through mass flow controller 32 and into three-way valve 41.

The system controller has adjusted three-way valve 41 so that all of the DIW coming into three-way valve 41 is directed into three-way valve 42. Similarly, three-way valve 42 directs all incoming DIW into three-way valve 43, which in turn, directs all of the DIW to tank 90. While not illustrated, a point of use filtration and purification (POUFP) apparatus is preferably provided on the DIW supply line so that all DIW passing into tank 90 is filtered and purified. The POUFP apparatus preferably has a 0.04 or 0.01 μm pore size rating and removes both positively and negatively charge particles and ionic contaminants.

The filtered and purified DIW then enters and fills tank 90. The photomaks are then submerged in the DIW. Tank 90 can be run in a quick dump rinse (QDR) mode but can be run in an overflow/cascade mode. During the rinsing, the system controller activates megasonic energy source 111 so that megasonic energy is applied to the photomask during the DIW rinse. Tank 90 is constructed of high purity flouropolymer or quartz and provides a high flow rinse to quickly quench reactions and remove chemical residues including sulfates from the photomask surfaces. The temperature of the DIW in tank 90 can vary from ambient to less than 90° C. If necessary, a cooler or heater can be provided on the DIW supply line.

At this point, the photomasks will need to be dried. While not illustrated, a sixth tank can be provided that is a dryer. The dryer tank can incorporate any known methods of drying, such as the use of a minute volume of IPA liquid (<10 ml per run) and will provide masks free of haze, streaks, and watermark after drying.

While wet bench system 100 is illustrated as making SOM for supply to tank 60, the system 100 can be easily adapted to supply a mixture of sulfuric acid and hydrogen peroxide (SPM) to tank 60 through proper programming of the controller. Similarly, the system 100 can be also be easily adapted to supply a mixture of sulfuric acid, ozone, and hydrogen peroxide (SOM/SPM) to tank 60.

Finally, while wet bench system 100 is illustrated as a system that draws the different fluids (i.e., the gases and liquids) from their separate reservoirs to form the mixtures and/or solutions during processing of photomasks, it is possible for the mixtures to be pre-made and stored in auxiliary tanks. Alternatively, each tank 60, 70, 80, 90, and 110 of system 100 can be provided with a recirculation loop. In this recirculation embodiment, each tank 60, 70, 80, 90, and 110 will be filled with a desired volume of the respective process fluid (i.e., single fluid, mixtures, and/or solutions) and the process fluid will be recirculated therethrough and used for multiple runs. In this embodiment, there is no mixing of fluids on the fly and a volume of process fluids can be used for over 12–24 hrs Referring now to FIG. 2 single wafer system 200 is illustrated. Single wafer system 200 is an alternative embodiment of the present invention, incorporating capabilities to strip and/or clean photomasks without having to transfer the photomask from tank to tank as with wet bench system 100. Single wafer system operates identically to wet bench system 100 except that the all of the fluid supply lines converge so that the SOM, DIW, DIO3, and dAPm can be supplied to a single process chamber 210. In order to avoid redundancy, only those aspects of single wafer system 100 that are different than wet bench system 100 will be discussed with the understanding that the single after system incorporates the same hardware and controller functionality.

Figure 2:
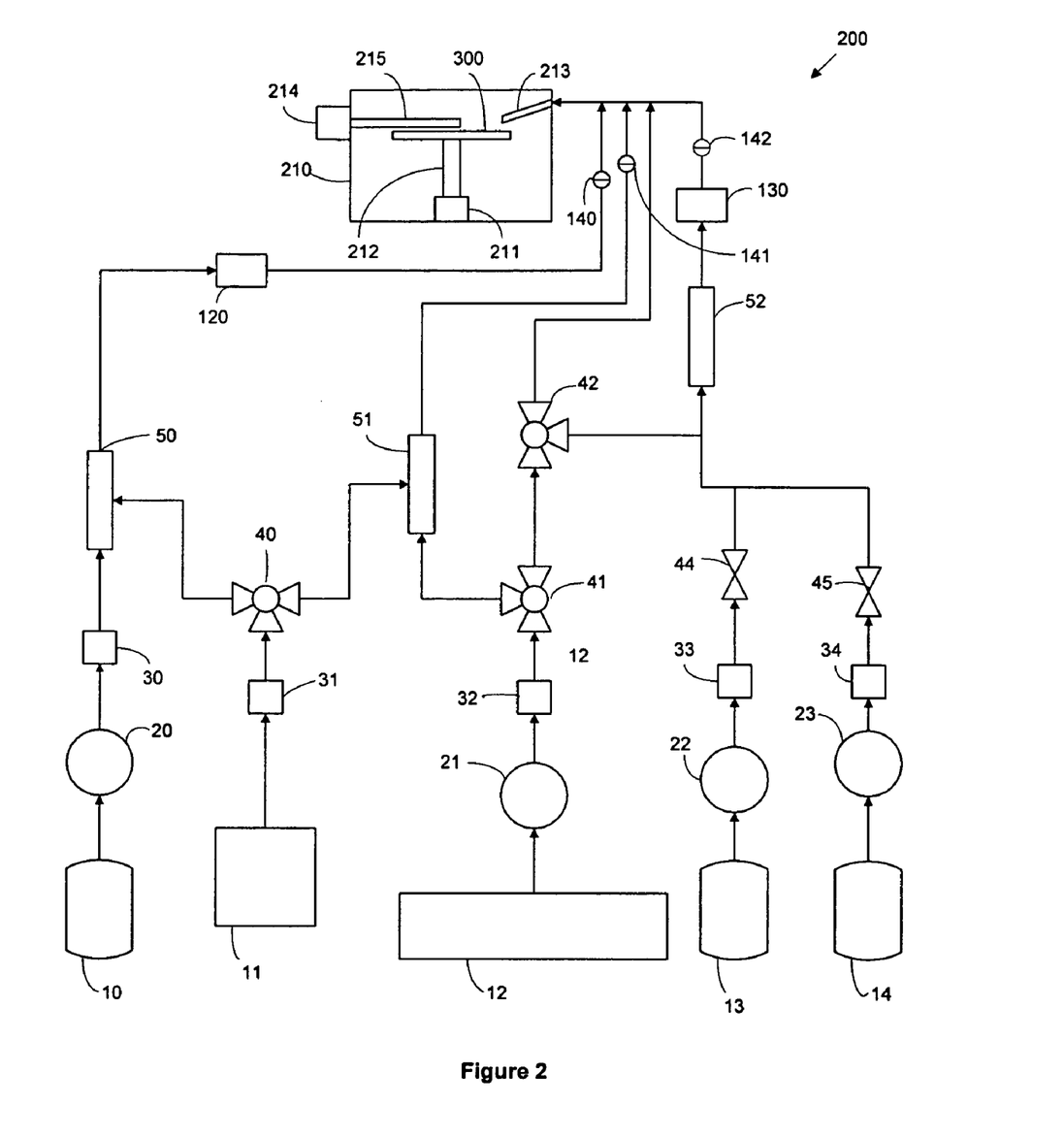
FIG. 2 is a schematic of a single wafer system adapted for stripping and/or cleaning photomasks according to an embodiment of the present invention.

Process chamber 210 comprises a nozzle 213, a transmitted probe 215, a megasonic energy source 214, a photomask support 212, and a motor 211. Support 212 is adapted to support a single photomask 300 in a substantially horizontal orientation. Transmitter 215 is positioned so that when a photomask is support by support 212, transmitted 215 is close to the surface of the photomask. When megasonic energy source 214 is activated, megasonic energy is transmitted through transmitter 215 and to the photomask 300. Nozzle 213 is fluidly coupled to a supply line that is capable of providing any of the fluids discussed above, such as DIW SOM, dAPM and $DIO_3$. By activating the appropriate valves, any one of these fluids can be supplied to the photomaask 300 via nozzle 213, and in any order. Alternatively, a plurality of nozzles could be used to apply the different fluids. Motor 211 rotates support 212 so that photomask 300 rotates during the application of the fluids. Single wafer system 200 affords the ability to be able to sequentially apply the various fluids of the invention to the photomask 300 without having to move the photomask to different tanks. Thus, the method of the invention can be carried out in a single chamber.

Wet bench system 100 and single wafer system 200 can be used to perform a variety of photomask processing sequences, such as stripping and/or cleaning, such as those shown in Tables 1–3 below. Table 1 exemplifies a desired stripping process according to the embodiment of the present invention. Table 2 exemplifies a final clean recipe. Table 3 exemplifies a final clean recipe that can be sued when defect density is low.

TABLE 1

Photo Resist Stripping Process

| Step | Chemicals | Time, min. | Temperature, C. | Mix Ratio | Megasonic Input, W |
|---|---|---|---|---|---|
| 1 | SOM (or SPM)/Meg | 8 | 80 | 98% wt $H_2SO_4$, <50 ppm $O_3$ (or 10 $H_2SO_4$:1 $H_2O_2$) | 0–1600 |
| 2 | Rinse/Meg | 10 | 70, at 5–10 gpm | 3 QDR + 7 min. cascade | 0–1600 |
| 3 | APM/Meg | 4 | 20 | 1 $NH_4OH$:2 $H_2O_2$:350 $H_2O$ | 0–1600 |
| 4 | Rinse/Meg | 8 | ambient, at 5–10 gpm | 2 QDR + 6 min. cascade | 0–1600 |
| 5 | Dry | 9 | ambient | IPA + $N_2$ followed by $N_2$ (and/or Application) | None (Expose photomask to a UV source if desired) |

TABLE 2

Final Clean Process

| Step | Chemicals | Time, min. | Temperature, C. | Mix Ratio | Megasonic Input, W |
|---|---|---|---|---|---|
| 1 | SOM (or SPM)/Meg | 5 | 80 | 98% wt $H_2SO_4$, <50 ppm $O_3$ (or 10 $H_2SO_4$:1 $H_2O_2$) | 0–1600 |
| 2 | Rinse/Meg | 10 | 70, at 5–10 gpm | 3 QDR + 7 min. cascade | 0–1600 |
| 3 | DIO3 | 2 | 24 C. | <50 ppm | 0–1600 |
| 4 | APM/Meg | 4 | 20 | 1 $NH_4OH$:2 $H_2O_2$:350 $H_2O$ | 0–1600 |
| 5 | Rinse/Meg | 8 | ambient, at 5–10 gpm | 2 QDR + 6 min. cascade | 0–1600 |
| 6 | Dry | 9 | ambient | IPA + $N_2$ followed by $N_2$ (and/or UV) | None (Expose photomask to a UV source if desired) |

TABLE 3

Final Clean Recipe (Used When Defect Density is Low)

| Step | Chemicals | Time, min. | Temperature, C. | Mix Ratio | Megasonic Input, W |
|---|---|---|---|---|---|
| 1 | DIO3 | 5 | 24 C. | <50 ppm | 0–1600 |
| 2 | APM/Meg | 4 | 20 | 1 $NH_4OH$:2 $H_2O_2$:350 $H2O$ | 0–1600 |
| 3 | Rinse/Meg | 8 | ambient, at 5–10 gpm | 2 QDR + 6 min. cascade | 0–1600 |
| 4 | Dry | 9 | ambient | IPA + $N_2$ followed by $N_2$ (and/or UV) | None (Expose photomask to a UV source if desired) |

While the process of Tables 1–3 can be carried out using system 100 or 200, it should be ted that the processes/methods are not limited to any specific system but can be carried out on variety of systems. The cleaning process used for mask cleaning was the combination of SOM, $DIO_3$, and dAPM chemistries followed by the dryer. SOM has the capability to remove both organic residues and post plasma ashed residues. The typical process temperature of this application is not higher than 80° C. Megasonics will maximize the removal efficiency of particulates and organic residues. Low temperature (18–30° C.) dAPM is used for additional particle removal. Particularly, the megasonic system, which can operate at high power levels with dAPM is extremely efficient at removing small particles down to 0.15 μm pixel size or lower. APM dilution can be as 1:x:y where 2<x<10 and 200<y<1000. A typical mix ratio at 1:2:350 at 20° C. for 4 min. was found to be optimum.

Additionally, the number of cleaning steps and sequence are determined by the desired results (optical properties, surface extractable ions, or particulates). For example, SPM/Rinse/DIO3/dAPM/Rinse/Dry can be used photoresist stripping followed by intermediate clean as SOM (or SPM)/Rinse/Dry. The final clean can be SOM (or SPM)/Rinse/APM/Rinse/Dry or DIO3/APM/Rinse/Dry. Additionally, the SOM (or SPM) application can be replaced with an application of a mixture having sulfuric acid, ozone, and hydrogen peroxide (SOM/SPM).

Experiment

In an experiment, photomasks were processed as shown in Tables 1–3 (using SOM) in specially designed tanks for optimum flow dynamics that provided the best cleaning process results. Using computational fluid dynamics methods and supported by fluid flow visualization techniques, the tank profile was designed for minimum volume and holds 1–10 masks. The masks were also held during process in a specially designed carrier that minimize the contact with the plate and maximized the exposure of the plate to chemical and rinse water. This resulted in low chemical and water consumption and high tool throughput i.e. lowest cost of ownership of the process tool.

Figure 3:
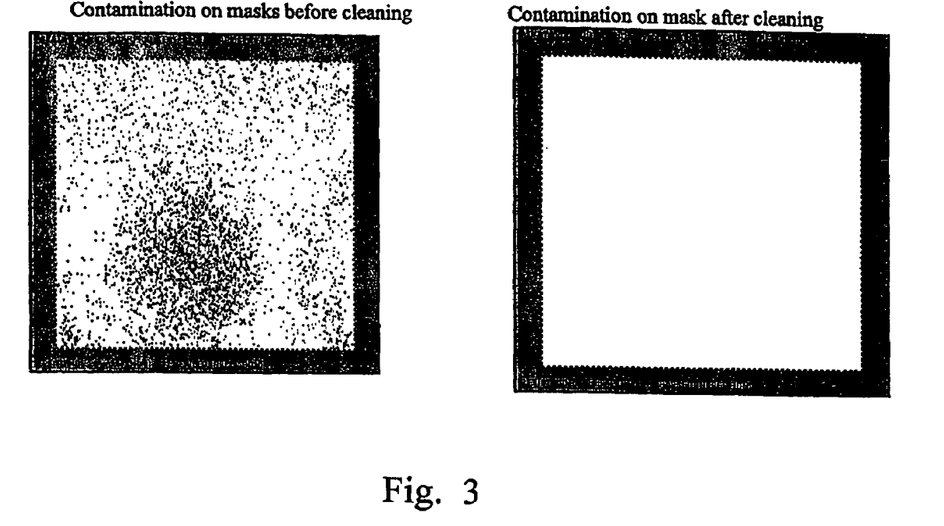
FIG. 3 is a pair of photographs comparing contamination on a photomask prior to cleaning and after cleaning according to the invention.
Figure 4:
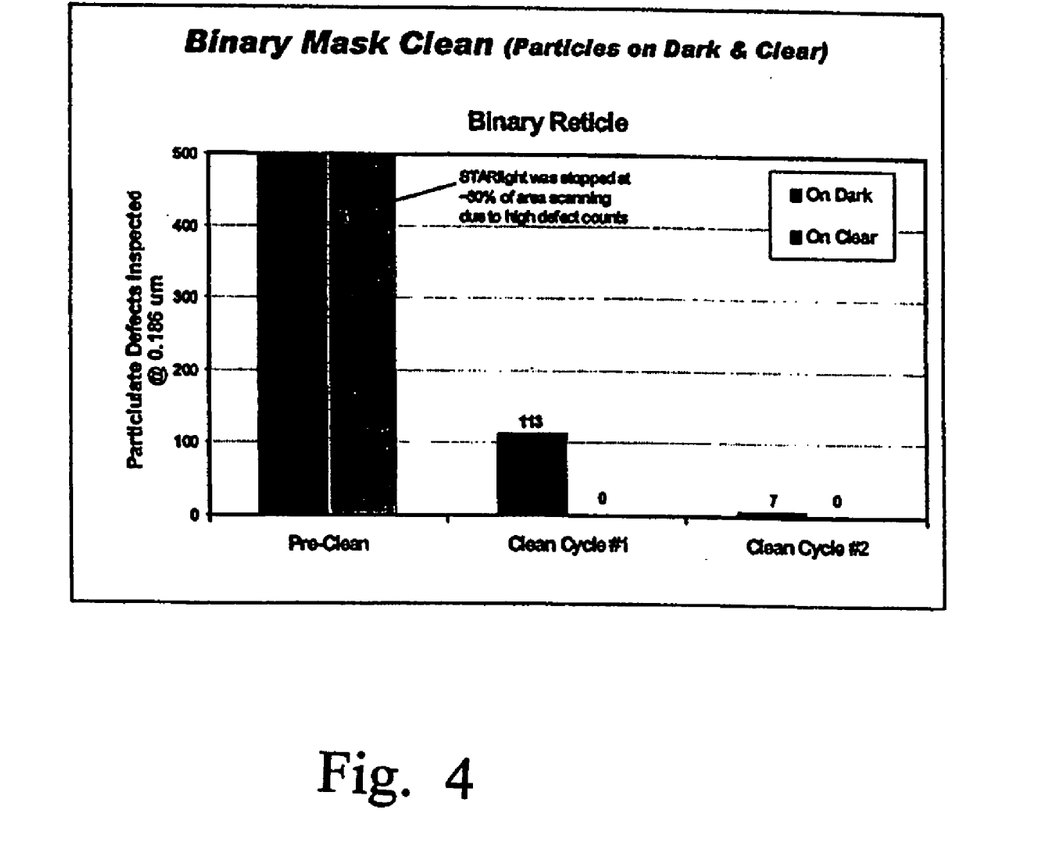
FIG. 4 is a graph showing binary photomask clean particle results on both dark and clear areas of the photomask.

The contamination levels before and after treatment are shown in FIG. 3. Defects were measured to 0.186 μm pixel size on masks cleaned on the tool of the invention. FIG. 4 shows the cleaning results of an EAPSM mask with 100% dark areas. It was cleaned several times in a single mask spray tool and then cleaned successively in a wet bench. A final count of 11 defects on dark was obtained.

Figure 5:
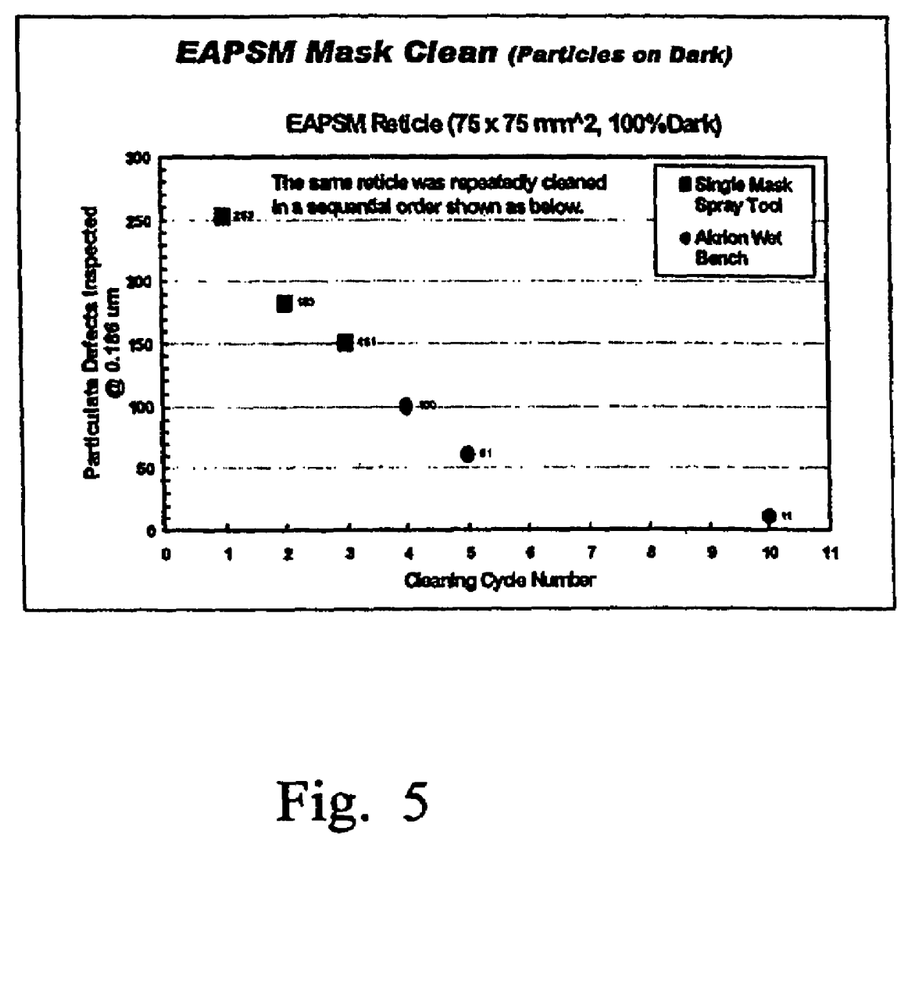
FIG. 5 is a graph showing the cleaning results of an EAPSM mask with 100% dark areas according to an embodiment of the present invention.

FIG. 5 shows results of a binary mask on both light and dark. The results after one clean show zero defects on clear and 113 on dark. After the second clean the results were zero on clear and 7 on dark.

The apparatus and method of the invention remove photoresist and clean the masks to the lowest possible defect level, surpassing the levels achieved by the prior art. The process of the invention can be used as part of manufacturing the photomasks or for marinating the photomasks during the IC manufacturing processes. Sulfate residues were obtained below 10 ppb on the mask surface after the clean. The process conditions and sequence were optimized to reduce or eliminate the impact on the optical properties and characteristics of the mask, e.g., phase loss, transmission, and CD variation.

While the invention has been described and exemplified in detail herein, various modifications, alternatives, and improvements should become readily apparent to those skilled in this art without departing from the spirit and scope thereof. Specifically, the inventive method is not limited to cleaning and/or stripping processes where all of the steps described above performed but can include cleaning and/or stripping processes that include one or more steps. For example, the invention can include stripping and/or cleaning processes that apply SOM and/or dAPM to a photomask while applying megasonic energy regardless of the additional steps (if any) performed. Similarly, the system of the invention can include systems where only one or more of the components are present.

What is claimed is:

1. A system for cleaning and/or photoresist stripping of photomasks comprising:
   a source of a mixture comprising sulfuric acid and ozone (SOM);
   a source of a dilute aqueous solution of ammonium hydroxide and hydrogen peroxide (dAPM);
   first means for supplying the SOM to a photomask;
   second means for supplying the dAPM to the photomask;
   means for supplying acoustical energy to the photomask; and
   a controller adapted to activate the SOM supply means and the acoustical energy supply means so as to supply acoustical energy to the photomask during supply of SOM to the photomask, and subsequent to completing the supply of the SOM and acoustical energy to the photomask, activate the dAPM supply means and the acoustical energy supply means so as to supply acoustical energy to the photomask during supply of dAPM to the photomask.

2. The system of claim 1 wherein the source of dAPM has a temperature less than 30° C.

3. The system of claim 1 further comprising:
   a source of ozonated deionized water ($DIO_3$); and
   means for supplying the $DIO_3$ to the photomask.

4. The system of claim 1 further comprising a plurality of process chambers, the SOM supply means located in a first process chamber and the dAPM supply means located in a second process chamber.

5. The system of claim 1 further comprising a process chamber, the SOM supply means and the dAPM supply means located in the process chamber.

6. The system of claim 1 further comprising means for dissolving ozone gas into the sulfuric acid.

7. The system of claim 1 wherein the source of SOM is at a temperature less than 90° C. and is free of bubbles.

8. The system of claim 1 further comprising:
   a source of deionized water;
   a source of ozonated deionized water ($DIO_3$);
   means for supplying the deionized water to the photomask;
   means for supplying the $DIO_3$ to the photomask; and
   wherein the controller is adapted to sequentially (i) activate the SOM supply means and the acoustical energy supply means so as to supply acoustical energy to the photomask during supply of SOM to the photomask, (ii) deactivate the SOM supply means, (iii) activate the deionized water supply means so as to rinse the photomask with the deionized water, (iv) deactivate the deionized water supply means, (v) activate the $DIO_3$ supply means so as to supply $DIO_3$ to the photomask, (vi) deactivate the $DIO_3$ supply means; (vii) activate the dAPM supply means and the acoustical energy supply means so as to supply acoustical energy to the photomask during supply of dAPM to the photomask, (viii) deactivate the dAPM supply means, and (ix) activate the deionized water supply means so as to rinse the photomask with the deionized water.

9. The system of claim 1 further comprising moans for supplying hydrogen peroxide to the SOM prior to the mixture being supplied to the photomasks.

* * * * *